United States Patent [19]

Fukuyama et al.

[11] 4,388,527
[45] Jun. 14, 1983

[54] PHOTOELECTRIC SWITCH

[75] Inventors: Toshifumi Fukuyama; Norio Onji, both of Kyoto, Japan

[73] Assignee: Omron Tateisi Electronics Co., Kyoto, Japan

[21] Appl. No.: 274,215

[22] Filed: Jun. 16, 1981

[30] Foreign Application Priority Data

Jun. 16, 1980 [JP] Japan .................................. 55/81102

[51] Int. Cl.³ ............................................. H01J 40/14
[52] U.S. Cl. ................................. 250/214 R; 307/311
[58] Field of Search .................. 250/221, 222, 214 R; 307/311; 340/556, 557

[56] References Cited

U.S. PATENT DOCUMENTS 3,859,647 1/1975 Ross ................................ 250/221 X Primary Examiner—David C. Nelms
Assistant Examiner—Darwin R. Hostetter
Attorney, Agent, or Firm—Schwartz, Jeffery, Schwaab, Mack, Blumenthal & Koch

[57] ABSTRACT

There is provided a photoelectric switch comprising a photoelectric detection means, a circuit means disposed independently of the detection means, and cable means interconnecting the detection and circuit means, there being formed in the photoelectric detection means a parallel circuit comprised of a light emission photodiode and a display photodiode of opposite polarity thereto as connected in parallel-circuit relation, which parallel circuit is connected to a pulse oscillation circuit included in the circuit means with a couple of lines, whereby a pulse current of single polarity is applied from the pulse oscillation circuit to the parallel circuit to thereby actuate only the light emission photodiode, and there being disposed in the circuit means a display circuit which functions in response to a detection output obtained in the circuit means so that through the tow lines a pulse current of opposite polarity to the first-mentioned pulse current flows to the parallel circuit in a phase where the first-mentioned pulse current is non-existent to thereby actuate the display photodiode.

2 Claims, 5 Drawing Figures

PHOTOELECTRIC SWITCH

BRIEF SUMMARY OF THE INVENTION

This invention relates to a photoelectric switch comprising a transmission or reflection type photoelectric detection means and a circuit means disposed independently of the first-mentioned means, said two means being interconnected by cable means.

In a photoelectric switch of the type comprising a photoelectric detector and a circuit as independent units, the cable interconnecting the units must comprise a total of 4 lines, namely two lines for a light-projecting photodiode and two lines for a light-receiving element. In the reflection type switch, where the light-projecting and light-receiving segments can be integrated, the light-projecting photodiode and light-receiving element can be taken care of with a common line so that a total of 3 lines may be provided. However, in the case of a transmission type switch, where the light-projecting segment must be disposed at a distance from the light-receiving segment, there must be provided a total of 4 lines as mentioned above.

In such a photoelectric switch, if a display photodiode for adjusting the optical axis of the system or for monitoring the action of the switch is provided on the detection side, it will be very convenient in regard to adjustment of installation position, etc.

However, if such a display photodiode is provided on the detection side, there must be provided two additional lines therefor, which would cause additional troubles. These troubles and disadvantages may be well understood from FIG. 1 of the accompanying drawing.

Referring to the block diagram of FIG. 1, the conventional switch comprises a light projecting device 1, 2 light-receiving device 2, a circuit device 3, a light emission photodiode 4, a display photodiode 5, a light-receiving element 6 such as a phototransistor, lenses 7 and 8, a light-receiving circuit 9, an a.c. amplifying circuit 10, a detection circuit 11, a switching circuit 12, an output relay 13, a pulse oscillation circuit 14, a display circuit 15, a constant voltage circuit 16 and a power supply circuit 17. In this conventional switch, when the display photodiode 5 is to be located in the photoelectric detection segment, there must be separately provided two lines for connecting the display photodiode 5 to output terminals 15a and 15b of the display circuit 15. Therefore, cable connections must be provided at six locations, i.e. input terminals 9a, 9b of light-receiving circuit 9, output terminals 14a, 14b of the pulse oscillation circuit 14, and output terminals 15a, 15b of the display circuit 15. This arrangement is liable to cause electrical misconnections and requires a troublesome wiring operation. Moreover, although such a disposition of the photoelectric detection segment and circuit segment in separate positions is intended to contribute to a miniaturization of the switch by constructing the photoelectric detection segment only of a light emission photodiode, a light-receiving element and optics, the increased number of lines that must be connected results in an increased diameter of the cable, thus jeopardizing the object of separating the photoelectric defection segment from the circuit segment.

This invention has as its object to provide a photoelectric switch such that a pulse current for actuating the display photodiode flows via a line for the light emission photodiode so that the number of lines is not increased even when the display photodiode is disposed on the photoelectric detection segment side.

This invention will hereinafter be described in detail by way of an embodiment shown in the accompaning drawings.

DETAILED DESCRIPTION

Figure 1:
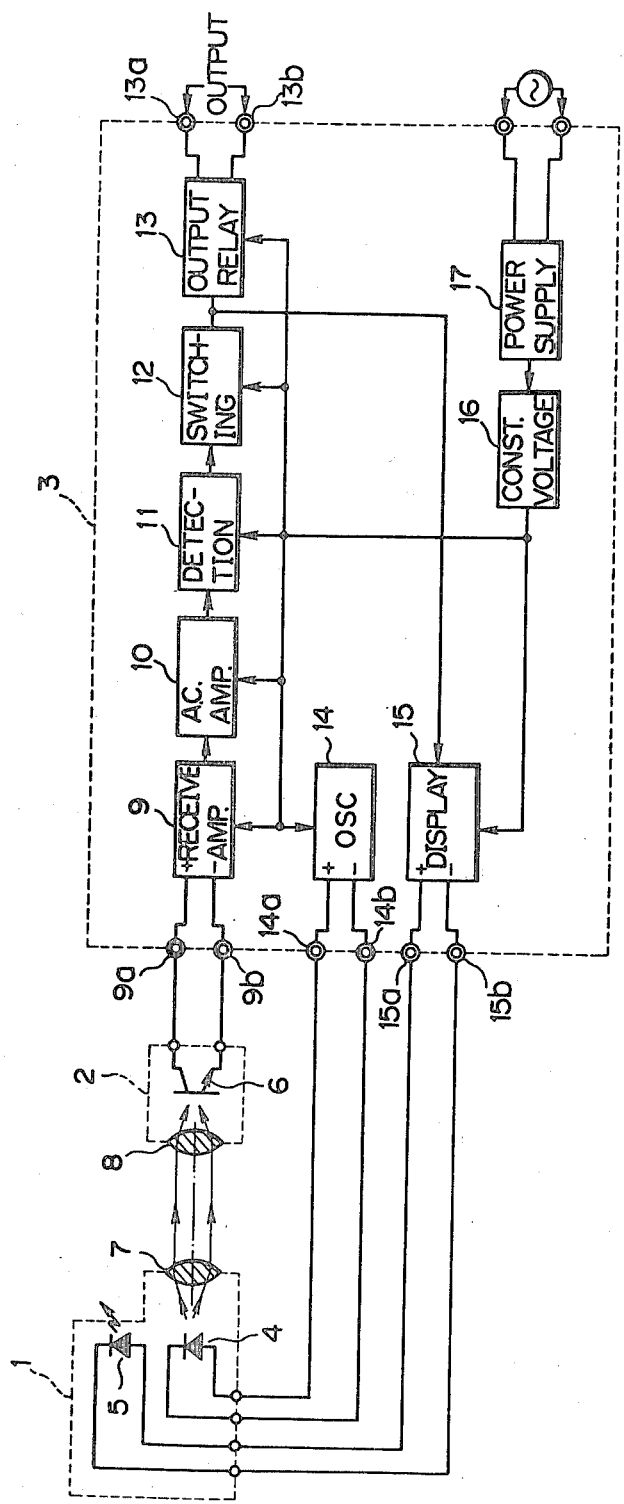
FIG. 1 is a block diagram of the conventional photoelectric switch.
Figure 2:
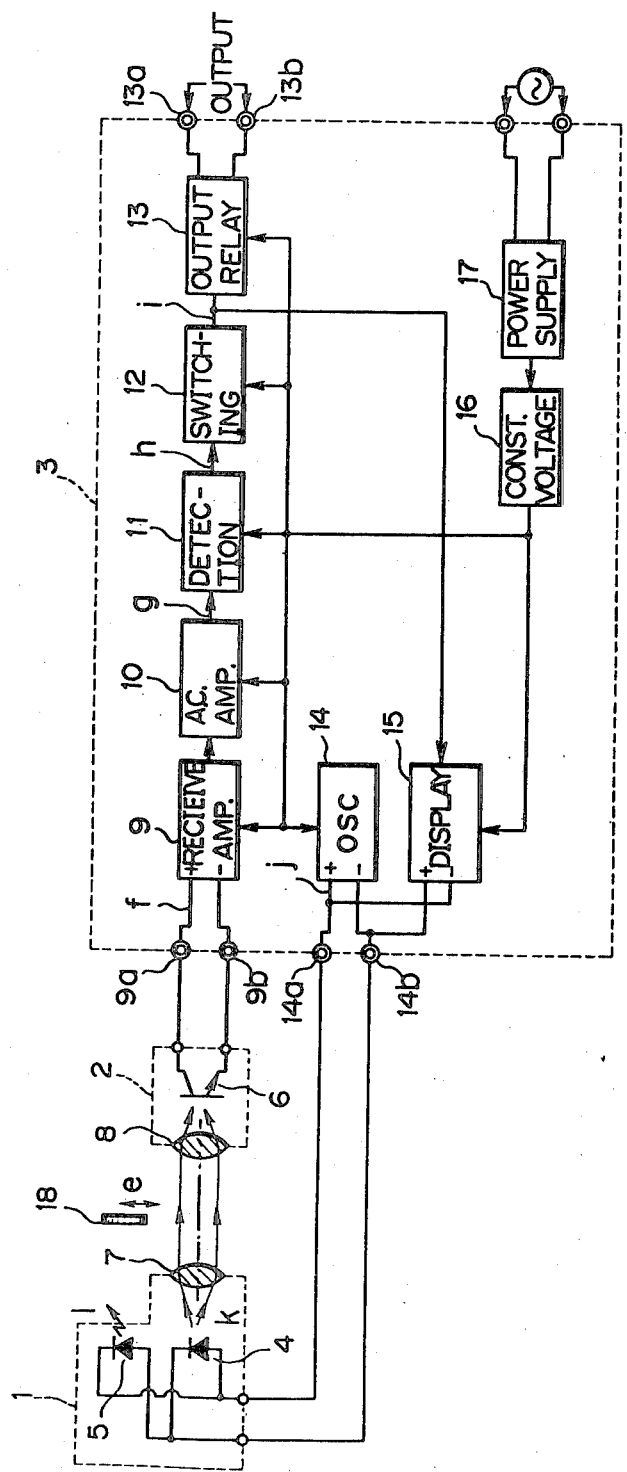
FIG. 2 is a block diagram of an embodiment of this invention.

Referring, now, to FIG. 2, a light emission photodiode 4 is in parallel circuit connection with a display photodiode 5 of opposite polarity and this parallel circuit is connected to output terminals 14a, 14b of a pulse oscillation circuit 14 via a couple of lines. For the purpose of making these two lines available also for a pulse current from a display circuit 15, the output of the display circuit 15 is connected to terminals 14a, 14b. Referring, further, to FIG. 2, reference numeral 18 designates an object to be detected, while other reference numerals designate the like parts of FIG. 1 and, therefore, are not explained.

The pulse current from the display circuit 15 is of opposite polarity to the pulse current from the pulse oscillation circuit 14. Therefore, the display circuit 15 is designed as illustrated either in FIG. 3 or in FIG. 4. In the construction illustrated in FIG. 3, generation of a pulse output at the pulse oscillation circuit 14 turns ON an output transistor 141 of the circuit 14 so that, as indicated in dotted line a, an electric current flows in the path of resistance 156→terminal 14a→light emission photodiode 4→terminal 14b, thus causing the light emission photodiode 4 to produce pulse light emissions. The detection output i from a switching circuit 12 (FIG. 2) is gated by a pulse output of the pulse oscillation circuit 14 in a NOR circuit, in such a manner that when the detection output i is "L" (low), a transistor 154 is turned ON only in the phase where no pulse output is existent and, consequently, current flows in the path of terminal 14b→display photodiode 5→terminal 14a→resistance 156→resistance 155→transistor 154 as indicated in solid lines, causing the display photodiode 5 to produce pulse light emissions.

Figure 3:
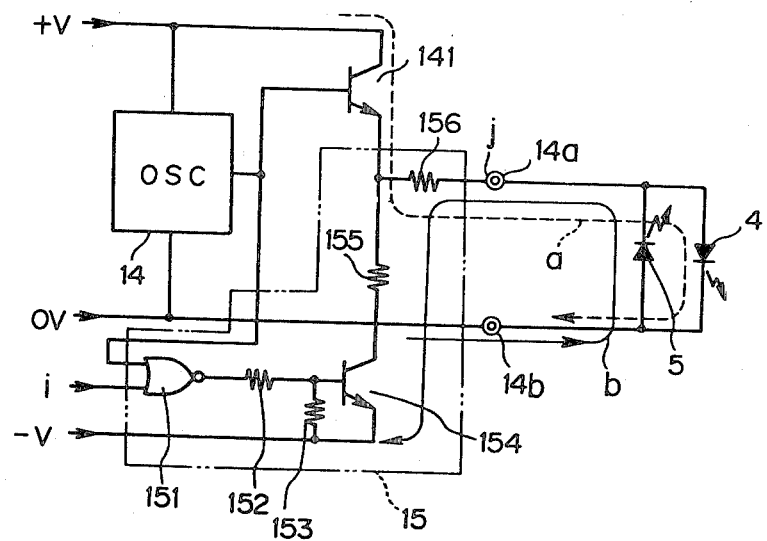
FIG. 3 is an example of the display circuit according to this invention.
Figure 4:
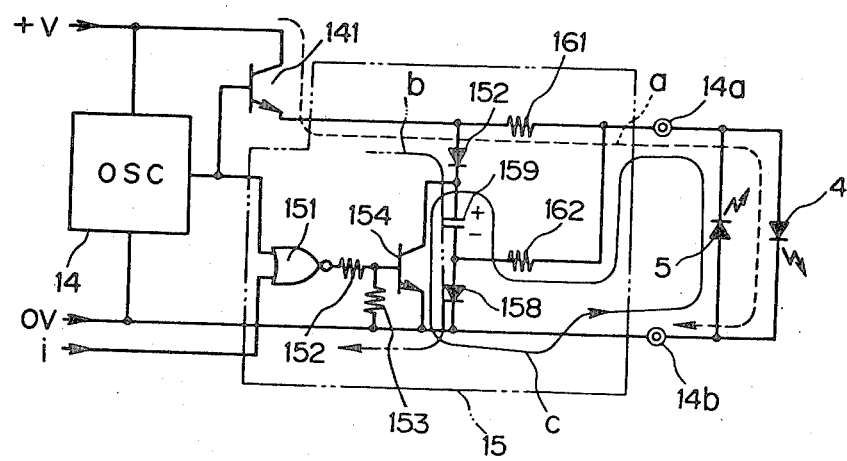
FIG. 4 is another example of the same circuit.

While the construction shown in FIG. 3 requires both a positive and a negative polarity power source, the construction of FIG. 4 requires only a positive power source. Referring to FIG. 4, photodiodes 157 and 158 constitute a charging circuit for a capacitor 159. When a transistor 141 is ON and current is flowing to a light emission photodiode 4 as indicated in dotted line a, the capacitor 159 is charged by the route indicated in dot-broken line b. And as a transistor 154 goes ON, the capacitor 159 is discharged by the route indicated in solid line c, i.e. transistor 154→terminal 14b→display photodiode 5→terminal 14a→resistance 162. In the case of FIG. 4 as well as that of FIG. 3, the detection output i is gated at NOR circuit 151 so that the transistor 154 is ON only when the transistor 141 is OFF.

Figure 5:
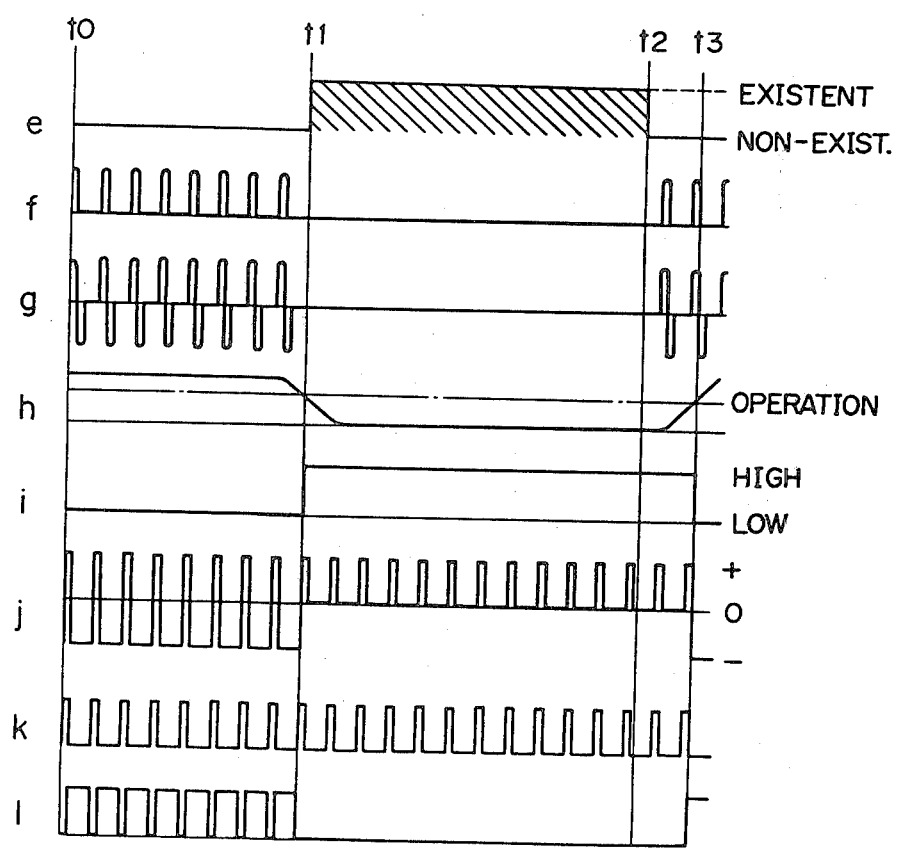
FIG. 5 is a waveform diagram showing the signal waveforms at the time-points e through l of FIG. 2.

The operation of the system of FIG. 2 will now be explained by way of the time chart of FIG. 5. When the object 18 to be detected is not existent as indicated at e ($t_0$–$t_1$), pulse light from a light-projecting unit 1 is incident on a light-receiving unit 2 so that a pulse light reception signal is generated from the light-receiving element 6 as indicated at f and is processed by a light-receiving circuit 9 and an a.c. amplifying circuit 10 into a signal shown at g in FIG. 5. This signal is detected by a detection circuit 11 to produce a d.c. detection output h. When the object 18 intercepts the pulse light from the light-projecting unit 1 ($t_1$–$t_2$), the light reception signal f and amplification output g are non-existent so that the detection output h drops below the operation level. As a result, the detection output i is obtained. In other words, the detection circuit i is "H" (high) when the object 18 is present and "L" (low) when it is absent. It is due to the time constant of the detection circuit 11 that the detection output i becomes "L" at time-point $t_3$ which is delayed from the time-point $t_2$ when the object 18 disappears.

When the detection output i is "L", a pulse current of opposite polarity to the pulse current of pulse oscillation circuit 14 flows from the display circuit 15 towards the light-projecting unit 1 in the phase where the pulse current of pulse oscillation circuit 14 is not existent. Thus, in the circuit of FIG. 3 or that of FIG. 4, when the detection output i is "L", the transistor 154 is turned ON only when the other input of NOR circuit 151 is "L", so that the transistor 154 goes ON only when the output of pulse oscillation circuit 14 is "L". Thus, when the output of pulse oscillation circuit 14 is "H", a pulse current flows in the direction for actuating the light emission photodiode 4 to cause the photodiode 4 to produce pulse light emissions (FIG. 5, k) while when the output of the circuit 14 is "L", an opposite pulse current flows (FIG. 5, j) to actuate the display photodiode 5 (FIG. 5, l). When the detection output i is "H", invariably the NOR circuit 151 is "L" and the transistor 154 OFF irrespective of whether the output of pulse oscillation circuit 14 is "H" or "L", so that the pulse current flows only to the light emission photodiode 4 (FIG. 5, j, k, l).

Therefore, in this embodiment, the display photodiode 5 goes OFF on detection of the object 18 and is ON while the object 18 is not detected.

It will be apparent from the foregoing description of a preferred embodiment of this invention that because the photoelectric switch of this invention is such that a pulse current for the display photodiode flows via the two lines primarily intended for the pulse current to the light emission photodiode, the aforementioned disadvantages of increasing of the number of cable lines connecting the photoelectric detection means to the circuit means can be completely obviated. Moreover, a simplification of the circuit can be accomplished by providing a capacitor adapted to be charged by a pulse current for the light emission photodiode and causing the discharge current of the capacitor to flow in a reverse direction so as to selectively turn on the display photodiode, in which only a single power source, rather than two power sources, i.e. a positive and a negative power source, is sufficient.

It should be understood that the above description is merely illustrative of the present invention and that many changes and modifications may be made by those skilled in the art without departing from the scope of the appended claims.

What is claimed is:

1. A photoelectric switch comprising a photoelectric detection means, a circuit means disposed independently of said detection means, and cable means interconnecting said detection and circuit means, there being formed in said photoelectric detection means a parallel circuit comprised of a light emission photodiode and a display photodiode of opposite polarity thereto as connected in parallelcircuit relation, which parallel circuit is connected to a pulse oscillation circuit included in said circuit means with a couple of lines, whereby a pulse current of single polarity is applied from said pulse oscillation circuit to said parallel circuit to thereby actuate only said light emission photodiode, and there being disposed in said circuit means a display circuit which functions in response to a detection output obtained in said circuit means so that through said two lines a pulse current of opposite polarity to the first-mentioned pulse current flows to said parallel circuit in a phase where said first-mentioned pulse current is non-existent to thereby actuate said display photodiode.

2. A photoelectric switch comprising a photoelectric detection means, a circuit means disposed independently of said detection means, and cable means interconnecting said detection and circuit means, there being formed in said photoelectric detection means a parallel circuit comprised of a light emission photodiode and a display photodiode of opposite polarity thereto as connected in parallelcircuit relation, which parallel circuit is connected to a pulse oscillation circuit included in said circuit means with a couple of lines, whereby a pulse current of single polarity is applied from said pulse oscillation circuit to said parallel circuit to thereby actuate only said light emission photodiode, and there being provided a display circuit comprising a capacitor which is charged by said pulse current, a gate circuit for gating the detection output obtained in said circuit means with the output of said pulse oscillation circuit and a switching element which turns on and off according to the output of said gate circuit to let a discharged current of said capacitor which is of opposite polarity to the first-mentioned pulse current flow via said parallel circuit and two lines connected thereto in such a manner that through said tow lines a pulse current of opposite rolarity to the first-mentioned pulse current may flow to said parallel circuit in a phase in which said first-mentioned pulse current is non-existent to thereby actuate said display photodiode.

* * * * *